United States Patent
Ozguz et al.

(10) Patent No.: US 7,768,113 B2
(45) Date of Patent: Aug. 3, 2010

(54) STACKABLE TIER STRUCTURE COMPRISING PREFABRICATED HIGH DENSITY FEEDTHROUGH

(76) Inventors: Volkan Ozguz, 34 Lyon Ridge, Aliso Viejo, CA (US) 92656; Jonathan Stern, 470 N. Coast Hwy., Laguna Beach, CA (US) 92651

( * ) Notice: Subject to any disclaimer, the term of this patent is extended or adjusted under 35 U.S.C. 154(b) by 325 days.

(21) Appl. No.: 11/441,908

(22) Filed: May 26, 2006

(65) Prior Publication Data
US 2006/0267213 A1 Nov. 30, 2006

Related U.S. Application Data

(60) Provisional application No. 60/684,372, filed on May 26, 2005.

(51) Int. Cl.
*H01L 23/02* (2006.01)
(52) U.S. Cl. ............... 257/686; 257/778; 257/784; 257/786; 257/E23.079
(58) Field of Classification Search .......... 257/784, 257/E25.023, 686, 778
See application file for complete search history.

(56) References Cited

U.S. PATENT DOCUMENTS

| | | | |
|---|---|---|---|
| 5,953,588 A | 9/1999 | Camien et al. | |
| 6,020,220 A | 2/2000 | Gilleo et al. | |
| 6,072,234 A | 6/2000 | Camien et al. | |
| 6,117,704 A | 9/2000 | Yamaguchi et al. | |
| 6,184,576 B1 * | 2/2001 | Jones et al. | 257/696 |
| 6,204,455 B1 | 3/2001 | Gilleo et al. | |
| 6,221,769 B1 * | 4/2001 | Dhong et al. | 438/667 |
| 6,294,837 B1 * | 9/2001 | Akram et al. | 257/774 |
| 6,614,104 B2 * | 9/2003 | Farnworth et al. | 257/686 |
| 6,746,894 B2 | 6/2004 | Fee et al. | |
| 6,756,681 B1 * | 6/2004 | Hanawa | 257/774 |
| 6,784,547 B2 | 8/2004 | Pepe et al. | |
| 6,797,537 B2 | 9/2004 | Pepe et al. | |
| 6,946,325 B2 | 9/2005 | Yean et al. | |
| 6,982,487 B2 | 1/2006 | Kim et al. | |
| 7,015,128 B1 * | 3/2006 | Chiang et al. | 438/612 |

(Continued)

FOREIGN PATENT DOCUMENTS

DE 10250621 A1 5/2004

(Continued)

OTHER PUBLICATIONS

Non-final Office Action issued in U.S. Appl. No. 11/524,090 mailed May 11, 2009 and received on May 13, 2009.

(Continued)

*Primary Examiner*—Wael Fahmy
*Assistant Examiner*—John C Ingham (57) ABSTRACT

A stackable tier structure comprising one or more integrated circuit die and one or more feedthrough structures is disclosed. The I/O pads of the integrated circuit die are electrically rerouted using conductive traces from the first side of the tier structure to a feedthrough structure comprising one ore more conductive structures. The conductive structures electrically route the integrated die pads to predetermined locations on the second side of the tier structure. The predetermined locations, such as exposed conductive pads or conductive posts, in turn, may be interconnected to a second tier structure or other circuitry to permit the fabrication of a three-dimensional microelectronic module comprising one or more stacked tiers.

24 Claims, 10 Drawing Sheets

U.S. PATENT DOCUMENTS

| | | | |
|---|---|---|---|
| 7,091,592 B2 * | 8/2006 | Chen et al. | 257/686 |
| 2003/0062631 A1 | 4/2003 | Nemoto | |
| 2003/0112610 A1 | 6/2003 | Frankowsky et al. | |
| 2005/0077632 A1 | 4/2005 | Hedler et al. | |
| 2005/0094490 A1 | 5/2005 | Thomenius et al. | |
| 2006/0079020 A1 | 4/2006 | Omizo et al. | |
| 2006/0091561 A1 | 5/2006 | Dangelmaier et al. | |
| 2006/0267213 A1 | 11/2006 | Ozguz et al. | |

FOREIGN PATENT DOCUMENTS

| | | |
|---|---|---|
| DE | 10348620 A1 | 6/2005 |
| DE | 102004027788 A1 | 1/2006 |
| EP | 0611129 A | 8/1994 |
| WO | WO 2006/032250 A | 3/2006 |

OTHER PUBLICATIONS

Communication from European Patent Office for EP 06 25 5467, dated Nov. 4, 2008.

European Search Report for EP 06 25 5467 completed Dec. 7, 2007.

US Office Action issued for U.S. Appl. No. 11/524,090 dated Nov. 18, 2009.

Non-final Office Action issued for U.S. Appl. No. 11/524,090 and mailed on Feb. 3, 2010.

* cited by examiner

STACKABLE TIER STRUCTURE COMPRISING PREFABRICATED HIGH DENSITY FEEDTHROUGH

CROSS REFERENCE TO RELATED APPLICATIONS

This application claims priority to U.S. Provisional Patent Application Ser. No. 60/684,372, entitled "Stackable Layers Comprised of Encapsulated Integrated Circuit Chips Interconnected With Prefabricated Via Structures", and filed May 26, 2005, which application is fully incorporated herein by reference.

STATEMENT REGARDING FEDERALLY SPONSORED RESEARCH AND DEVELOPMENT

Not applicable

BACKGROUND OF THE INVENTION

1. Field of the Invention

The invention relates generally to stackable tier structures comprising microelectronic circuitry. More particularly, the invention relates to stackable tier structures comprising one or more integrated circuit die and one or more area interconnect or "feedthrough structures", which tiers may be stacked and interconnected to create compact, three-dimensional microelectronic modules.

2. Description of the Related Art

The ability to form very thin, stackable layers, each containing one or a plurality of homogeneous or heterogeneous integrated circuit chips is desirable and allows high density, high speed electronic systems to be assembled for use in military, space, security and other applications.

Examples of such layers and modules, referred to as "neo-layers" or "neo-stacks" are disclosed in U.S. Pat. No. 6,797,537, Method of Making Stackable Layers Containing Encapsulated Integrated Circuit Chips With One or More Overlying Interconnect Layers, U.S. Pat. No. 6,784,547, Stackable Layers Containing Encapsulated Integrated Circuit Chips With One or More Overlying Interconnect Layers, U.S. Pat. No. 6,117,704, Stackable Layer Containing Encapsulated Chips, U.S. Pat. No. 6,072,234, Stack of Equal Layer Neo-Chips Containing Encapsulated IC Chips of Different Sizes, and U.S. Pat. No. 5,953,588, Stackable Layers Containing Encapsulated IC Chips, all of which are incorporated fully herein by reference and all of which are assigned to Irvine Sensors Corp., the assignee herein.

The stacking and interconnection of very thin microelectronic layers allows high circuit speeds in part because of short lead lengths and related reduced parasitic impedance and electron time-of-flight. These desirable features combined with a very high number of circuit and layer interconnections allows relatively large I/O designs to be implemented in a small volume. What is needed is a structure that combines the above attributes but that can be fabricated using well-defined processes at relatively low cost.

BRIEF SUMMARY OF THE INVENTION

A stackable tier structure comprising one or more homogeneous or heterogeneous integrated circuit die (ICs) and one or more area interconnect structures, referred to as feedthrough structures, is disclosed. The I/O, power and ground pads of the integrated circuit die are electrically rerouted using conductive traces from the first side of the tier structure to a feedthrough structure comprising one ore more conductive structures contained within it. The conductive structures, such as a conductive vias, stacked stud bumps or encapsulated metallized polymer columns electrically route the integrated die pads to predetermined locations on the second side of the tier structure. The predetermined locations, such as exposed conductive pads or connected outwardly depending metallized polymer columns, in turn, may be interconnected to a second tier structure or external circuitry to allow the fabrication of a three-dimensional microelectronic module comprising one or more stacked tiers that maintain high circuit density with a relatively small form factor.

DETAILED DESCRIPTION OF THE INVENTION

Figure 1A:
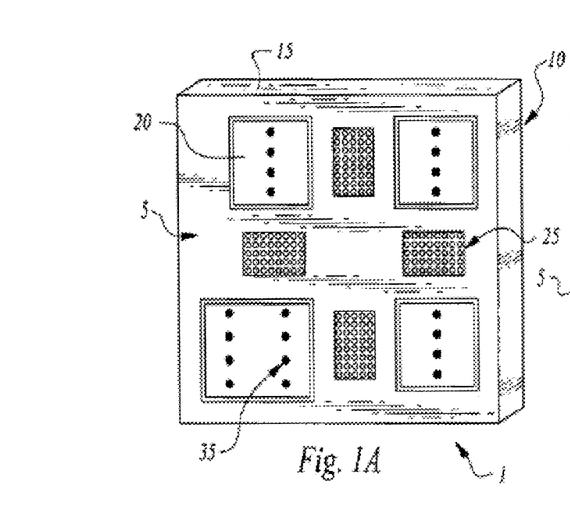
FIGS. 1A and 1B illustrate a molded tier frame and a "die-in-silicon" tier frame, respectively, showing integrated circuit die and feedthrough structures of the invention.
Figures 1B, 2B:
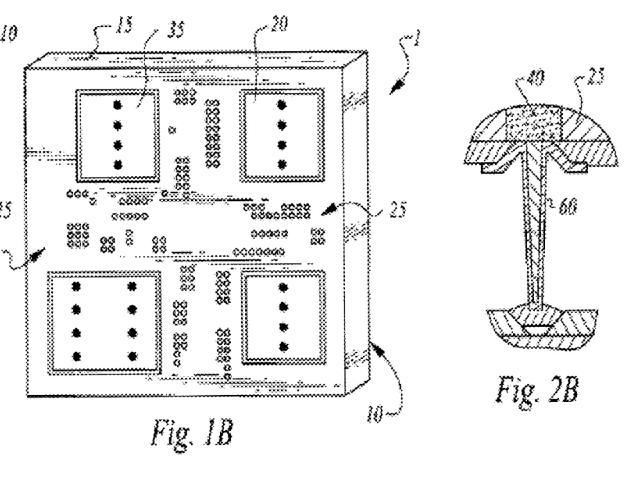
FIG. 2B shows a detail of FIG. 2A and the metallized polymer column thereof.

Turning now to the figures wherein like numerals designate like elements among the several views, FIGS. 1a and 1b show preferred alternative embodiments of the stackable tier structure 1 of the present invention with the tier thickness exaggerated. As will be described more fully below, tier 1 generally comprises opposing first tier side 5 and second tier side 10. Tier 1 is further comprised of a tier frame 15, one or more integrated circuit die 20 and one or more feedthrough structures 25.

Integrated circuit die 20 comprises active circuitry and one or more I/O pads 35 for the routing of electrical signals to and from the active circuitry on the die.

I/O pads 35 are disposed in tier frame 15 so as to be substantially coplanar with first tier side 5 by embedding integrated circuit die 20 in tier frame 15 as further discussed below.

Figure 2A:
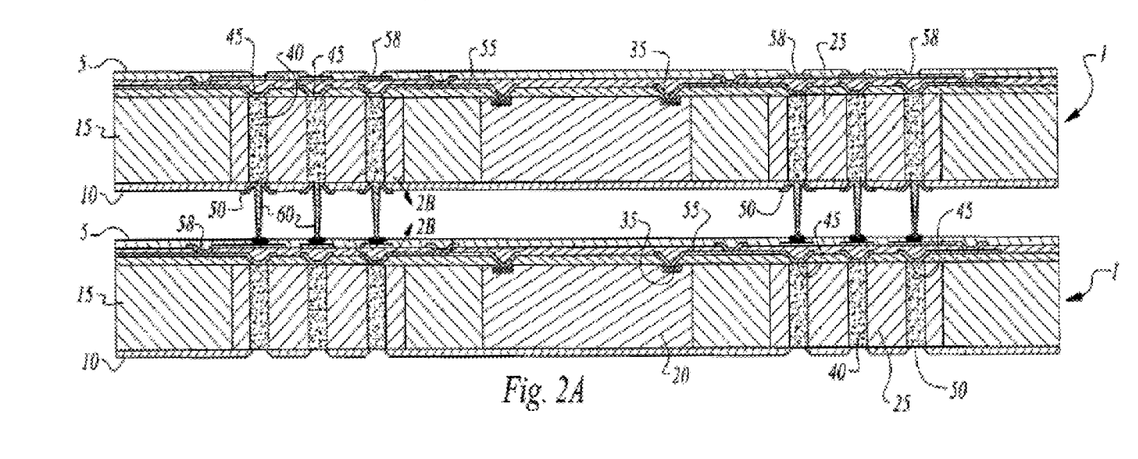
FIG. 2A shows a stacked, two-tier module with the respective tier structures interconnected by means of metallized polymer columns.
Figure 3A:
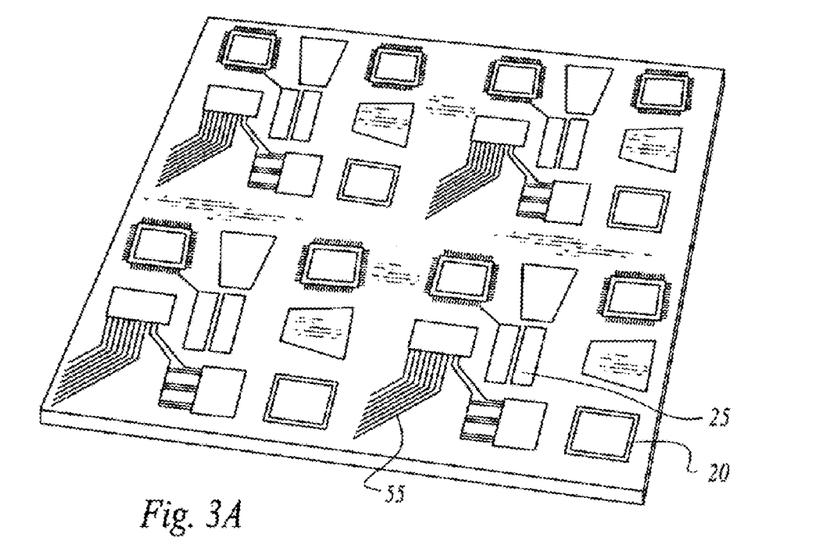
FIGS. 3A and 3B are a 2×2 array of unsingulated molded tier structures and a top view of a molded tier structure showing conductive traces for the rerouting of signals from the I/O pads of an integrated circuit die to a feedthrough structure.
Figure 3B:
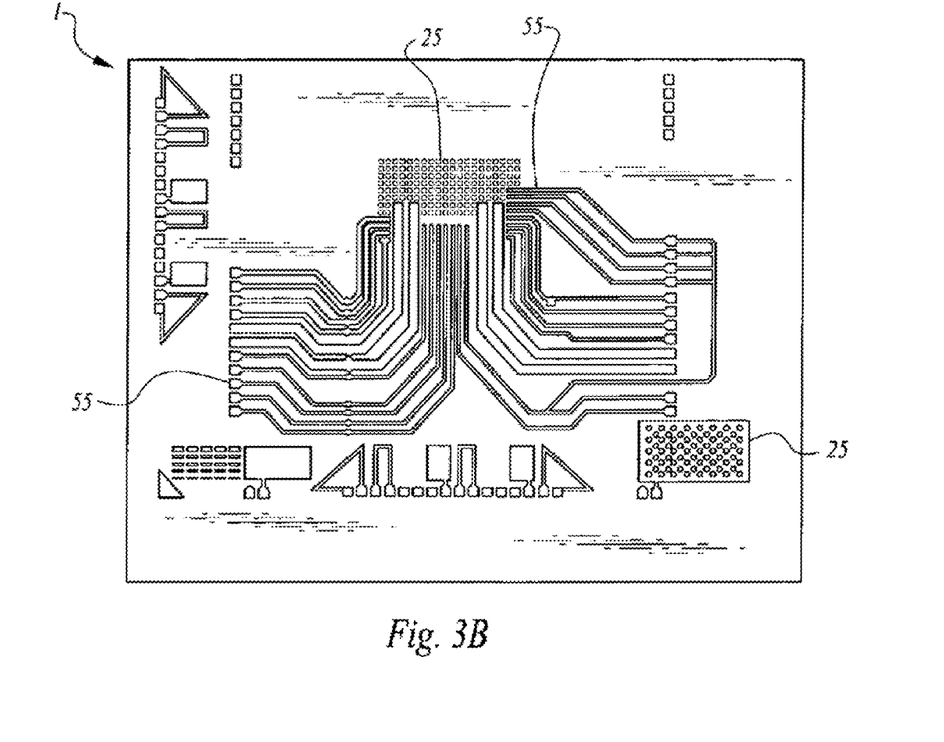

FIG. 2 reflects a stack of two interconnected tier structures as more fully discussed below, wherein feedthrough structure 25 is comprised of one or more electrically conductive structures 40 which have a first terminal end 45 terminating on first tier side 5 and a second terminal end 50 terminating on second tier side 10. In this manner, an electrically conductive area interconnect is available for the routing of electrical signals through the thickness of the tier frame material to and from the respective surfaces of tier 1 and the devices thereon.

A conductive trace 55 is provided on first tier side 5 to electrically connect I/O pad 35 to first terminal end 45 on first tier side 5 which is electrically connected to second terminal end 50. Second terminal end 50 is disposed and accessible on second tier side 10.

In the alternative preferred embodiment of tier structure 1 illustrated in FIG. 1*a*, FIG. 2 and FIGS. 3*a* and 3*b*, one or more prefabricated feedthrough structures 25 and one or more prefabricated integrated circuit die 20, each having one or more I/O pads 35, are molded in a dielectric material at predetermined locations in tier frame 15 using a suitable potting material such as Epoxy Set 3030 to define a tier structure having an initial thickness. All manner of integrated circuit die 20 may be included in the molded tier frame embodiment, including, without limitation, packaged, unpackaged or depackaged die, FPGA die, microprocessor die, memory die or the like. Homogeneous or heterogeneous die may be incorporated into the tier frame, dependant upon the end needs of the user. Feedthrough structures may be fabricated in a separate operation or purchased from a separate source for assembly into the tier of the invention in one of its embodiments.

The active circuitry of integrated circuit die 20 and the prefabricated feedthrough structure surface are preferably encapsulated so that all element surfaces are approximately coplanar with first tier side 5. This may be accomplished, for example by providing a die and prefabricated feedthrough structure of substantially the same thickness and affixing the active circuitry on the die and a surface of the feedthrough structure in a mold using a temporary adhesive. The elements are then potted in an encapsulant to approximately the thickness of the die and feedthrough structure.

A predetermined portion of second tier side 10, inactive die surface and the opposing surface of the feedthrough structure is then removed along with any excess thickness of potting material by grinding, lapping, CMP or equivalent means whereby the desired tier planarization and thickness is achieved.

The temporary adhesive that bonds the active surface of the die and feedthrough structure in the mold is released, providing a tier 1 with accessible I/O pads and a feedthrough structure with accessible first and second terminal ends.

Using known semiconductor packaging and thinning processes, tier thickness in the range of 200 microns or thinner are achievable.

After desired tier thinning, a dielectric or passivation layer, such as a polyimide, is provided on the first and second tier sides. I/O pads 35 and the conductive first terminal ends 45 are exposed through the dielectric layer to define interconnection points as contact pads using well-known photolithographic processes. The selected ones of exposed I/O pads 35 and exposed first terminal ends 45 are interconnected and/or rerouted to predetermined locations using metallized conductive traces 55. Metallized conductive traces 55 are fabricated as is well-known in the photolithographic arts to interconnect appropriate conductive structures and I/O pads. A contact pad for interconnection may also be conveniently defined at a desired location by exposing a section of a conductive trace as well. Multiple reroute metallization layers can be readily fabricated by repeating the polyimide, via formation, metallization steps. The use of multiple layers of reroute metallization allows the fabrication of complex circuitry on the surface of the tier which is necessary for high I/O count devices such as field programmable gate arrays (FPGAs).

In a preferred embodiment, second tier 10 comprises exposed second terminal ends 50 of feedthrough structure 25, some or all of which may be in electrical connection with I/O pads 35. Using processes as discussed above, exposed second terminal ends 50 on second tier side 10 can be electrically connected to additional tier layers using outwardly depending conductive metallized polymer columns formed on contact pads created by the exposed terminal ends or an exposed conductive trace (discussed below) or be electrically routed to predetermined locations on second tier side 10 for electrical connection to another device or circuit.

Figures 4A, 4B:
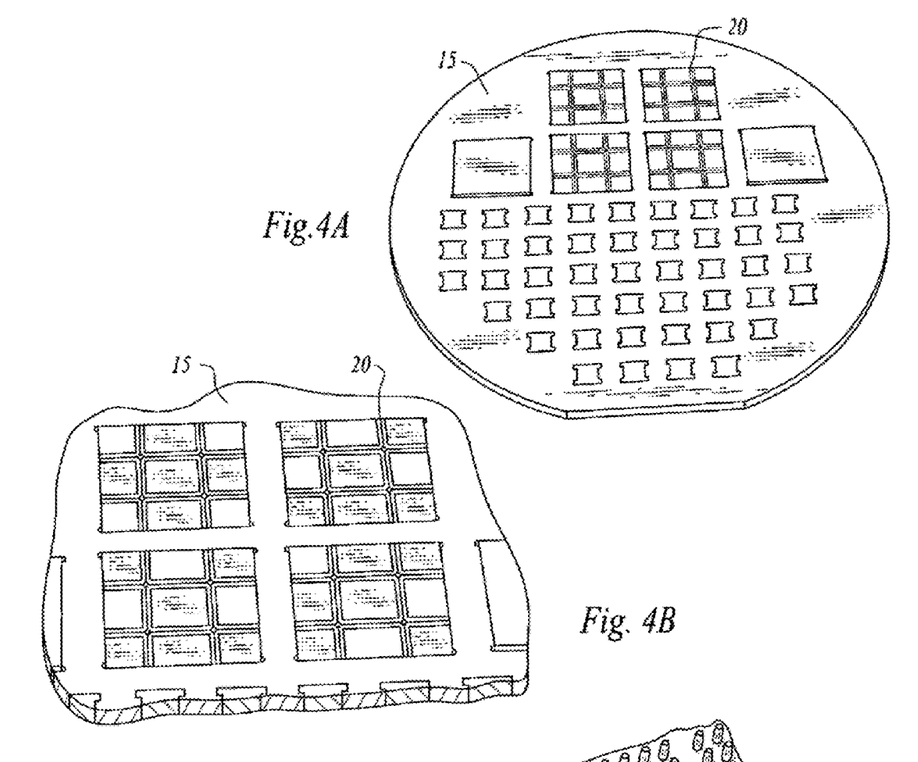
FIGS. 4A and 4B reflect an array of "die-in-silicon" tier structures wherein prefabricated integrated circuit die have been embedded in a silicon tier frame by means of an epoxy.

In an alternative preferred embodiment of the tier frame 15 of the invention reflected in FIG. 1*b* and FIGS. 4*a* and 4*b*, very thin tier frame structures may be desirably prefabricated from high resistivity silicon wafers, for instance silicon with a resistivity of 100 ohms/cm. The use of silicon as a tier frame material provides a well-matched thermal expansion coefficient with respect to embedded active silicon integrated circuit die and/or silicon feedthrough structures. Separately fabricated silicon feedthroughs can also be fabricated directly into the silicon tier frame material, creating an integral tier frame and feedthrough assembly with the beneficial result of a unitary tier frame/feedthrough assembly and a matched coefficient of thermal expansion.

As in the molded tier frame embodiment, all manner of integrated circuit die may be incorporated into this embodiment.

In the alternative silicon tier frame embodiment, apertures for the receiving of integrated circuit die and prefabricated feedthrough structures are defined in a silicon wafer or blank, preferably by use of photolithographic processes using a dry reactive ion etch process (DRIE) or using water-jet cut silicon blanks. The DRIE process is preferred because of its ability to create well-defined vertical sidewalls and for its ability to bulk etch silicon material. The use of DRIE provides precision matched apertures for receiving integrated circuit die and prefabricated feedthrough structures with a minimum gap between the die and aperture side wall.

Any silicon removal means may be utilized to define the appropriate apertures with acceptable tolerance and edge roughness.

In a silicon tier frame embodiment, integrated circuit die and/or prefabricated feedthrough structures are placed in their respective apertures and any aperture sidewall gaps filled with appropriate filler or potting material. Epoxy Set 3030 has been found to have suitable characteristics for gap filling in the silicon tier frame embodiment.

Figure 5:
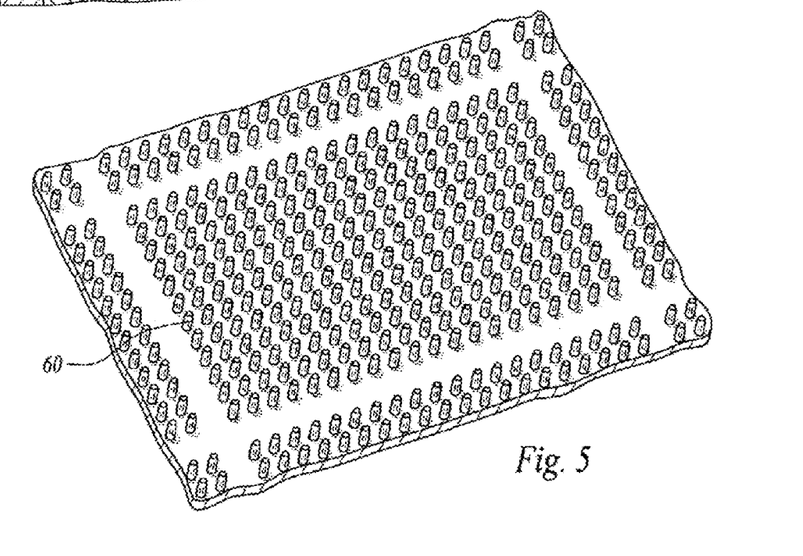
FIG. 5 illustrates an array of metallized polymer columns.

The process used to define high aspect ratio metallized polymer columns can be conveniently used to create prefabricated feedthrough structures for use in the instant invention. In a preferred embodiment of the invention, the fabrication of the feedthrough structures which provide a conductive path through the thickness of the tier frame material is completed using conductive metallized polymer formed using a solderable photoresist. In this preferred embodiment, a high contrast epoxy based photoresist is used to fabricate a column array and base as shown in FIG. 5 of a predetermined pitch. One or more columns 60 are preferably formed using as high optical transparency photoresist such as SU-8 photoresists available from MicroChem Corp. The SU-8 photoresists are capable of forming high aspect ratio features and very straight sidewall structures such as are found in MEMS applications.

A field metal such as gold is plated upon the surface of the photoresist column structures 60 and base whereby the entire column array is electrically conductive. The column structure array and base are encapsulated in a suitable dielectric encapsulant and the base and upper portion of the metallized columns are removed whereby the individual metallized columns are singulated within the encapsulated structure to form an array of conductive, pipe-like structures within the encapsulated feedthrough structure.

An alternative embodiment of the feedthrough structure of the invention is the use of multiple stacked stud bumps formed by the use of wire bonding equipment. Columns of wire balls, or stud bumps (not shown) may be fabricated on a sacrificial substrate at a predetermined pitch, encapsulated in a suitable dielectric material, and the sacrificial substrate removed by back thinning. The surface of the feedthrough structure assembly is ground to expose the top-most stud bump in the columns. The resultant structure comprises an array of encapsulated conductive columns suitable for use in the instant invention.

In yet a further alternative preferred embodiment of a feedthrough structure of the invention, through vias are defined in high resistivity silicon wafers at predetermined locations. The vias are plated or filled with a conductive material such as copper to create a feedthrough structure comprising generally opposing first feedthrough structure surface and second feedthrough structure surface, each with one or more exposed conductive vias for electrical connection between the first feedthrough structure surface and second feedthrough structure.

A preferred embodiment of a prefabricated silicon feedthrough structure comprises one or more 65 um diameter vias with a 250 um pitch such as are available from Tru-Si Technologies, Inc. The vias are filled with copper such that when the feedthrough structure is backthinned, the copper material in the vias are exposed, creating a very thin feedthrough structure. One or more feedthrough structures can be fabricated in a single silicon wafer and singulated using a conventional wafer dicing saw.

In yet a further alternative preferred embodiment of the feedthrough structure of the invention, in the case of the silicon tier frame embodiment, the feedthrough structures are desirably formed directly in and integral with the tier frame silicon material itself using this "via-in-silicon" method.

Figure 6:
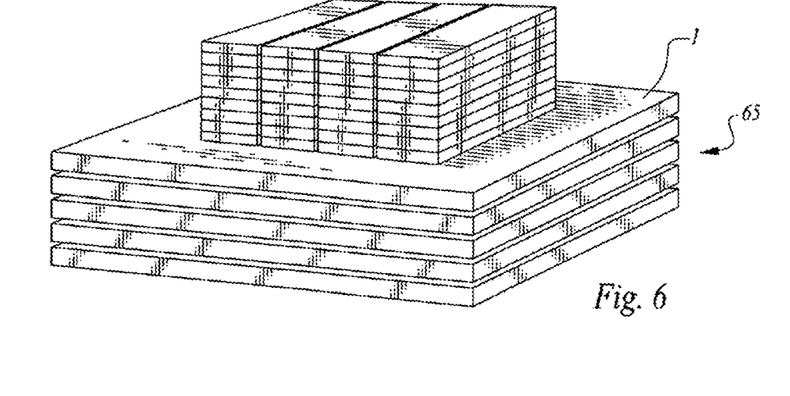
FIG. 6 shows a three-dimensional stack of interconnected tiers.
Figure 7A:
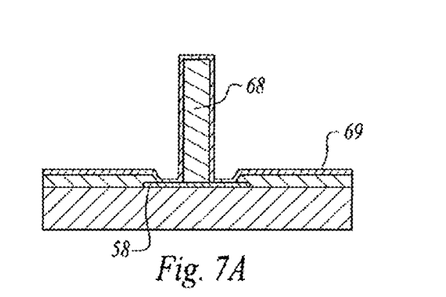
FIGS. 7A, 7B, 7C, and 7D disclose process steps in a method of forming a metallized polymer column.
Figure 7B:
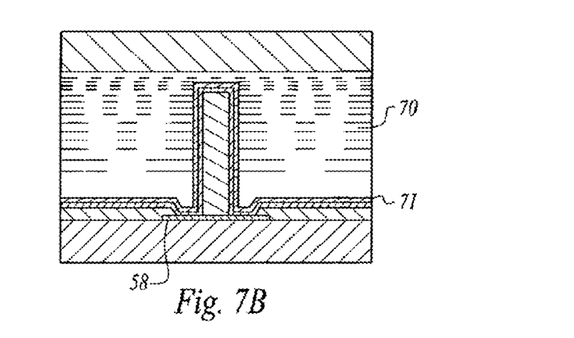
Figure 7C:
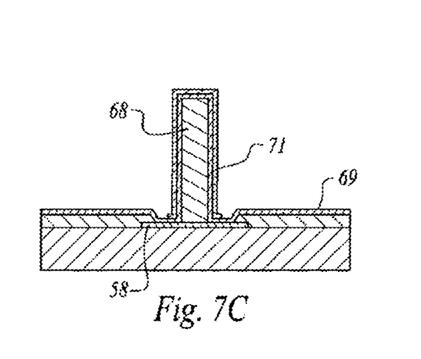
Figure 7D:
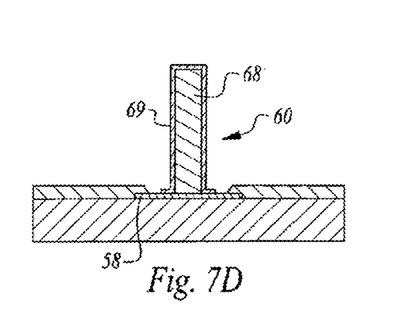

As indicated above, the disclosed embodiments of the tier structures may be stacked and electrically interconnected to form a high density electronic module 65 as is reflected in FIG. 2 and FIG. 6 using suitable means for electrically connecting the layers.

A preferred embodiment of the stacked module 65 of the invention comprises exposing first or second terminal ends or predetermined portions of the conductive traces on selected surfaces of the tier structures to be interconnected to create conductive pads on the respective sides of the tiers. Selected ones of the conductive pads on the respective sides of the tiers are defined so as to be aligned and in registration with one another. Metallized polymer columns 60 are formed on the conductive pad surfaces on one of the tiers, preferably using a metallized, solderable photoresist column.

As seen in FIG. 7, a preferred process for forming metallized polymer columns upon exposed conductive pads or interconnect points comprises applying a SU-8 layer over the selected tier side. A columnar SU-8 structure is defined approximately central upon the respective conductive pads with a cross-sectional area less than the area of the conductive pads using well-known photolithographic processes. The structures are defined so as to be in registry with the respective pads of the corresponding tier on which they will be electrically connected. The cross-section of the polymer column is less than the exposed area of the conductive pad to ensure subsequent electrical connection of the two when conductive plating occurs.

A field metal such as gold is applied over the tier surface so as to plate SU-8 column structure surface area and the conductive pads or interconnect points. This step effectively puts the metallization of plated SU-8 structure in electrical connection with the conductive pad on which it is disposed. A second photolithographic step using a high refractive index fluid in immersion lithography is performed to apply a photoresist mask layer to the SU-8 column structure surface area. The field metal is then etched from exposed surfaces and the remaining photoresist striped from the SU-8 column structure, leaving one or more high aspect ratio, electrically conductive metallized polymer columns in electrical connection with the underlying conductive pad.

Figure 8A:
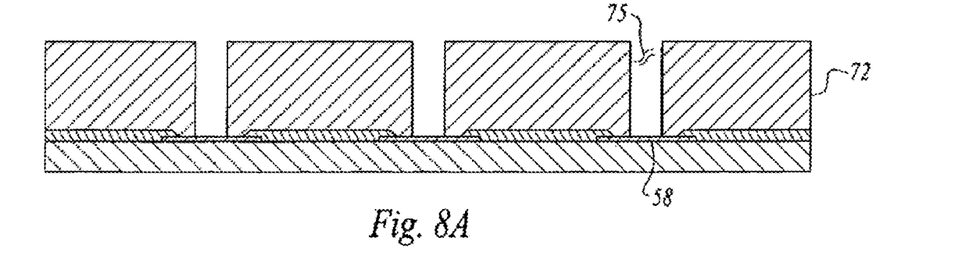
FIGS. 8A, 8B, and 8C show steps in an alternative method of forming a metallized polymer column.
Figure 8B:
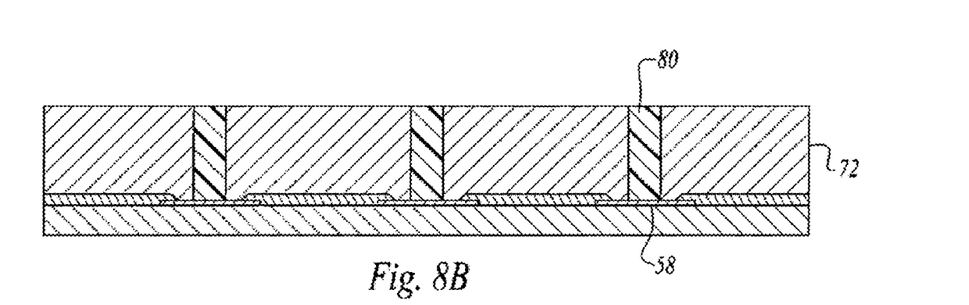
Figure 8C:
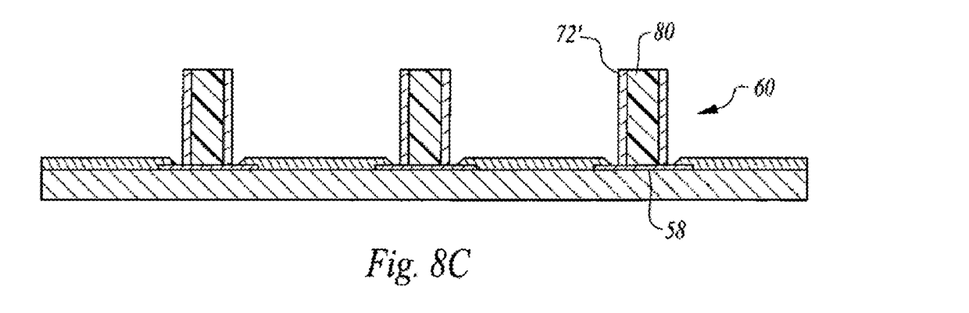

An alternative method of metallized polymer column fabrication is illustrated in FIG. 8.

After metallized polymer column fabrication, a solder material is disposed upon the conductive pads or interconnect points of the corresponding tier structure which may, for instance comprise the terminal end of a conductive structure or an I/O pad. The metallized polymer columns are oriented such that, upon solder reflow, an electrical connection is formed between the metallized polymer columns, the solder material and the respective conductive pads.

Alternative methods of electrically interconnecting the respective tiers include, without limitation, the use of stacked stud bumps in connection with respective conductive pads or the use of soldering, solder pastes, conductive epoxies, anisotropic conductive films or anisotropic conductive adhesives.

It is noted that the use of metallized polymer columns to interconnect tier structures can be used to provide a beneficial "stand-off" between tiers such that an airflow or coolant flow may desirably be directed between tiers as a thermal management tool. To provide alternative or supplemental cooling to the tiers in the module, a thermal management element, such as a copper shim may be disposed between tier layers.

Figure 9:
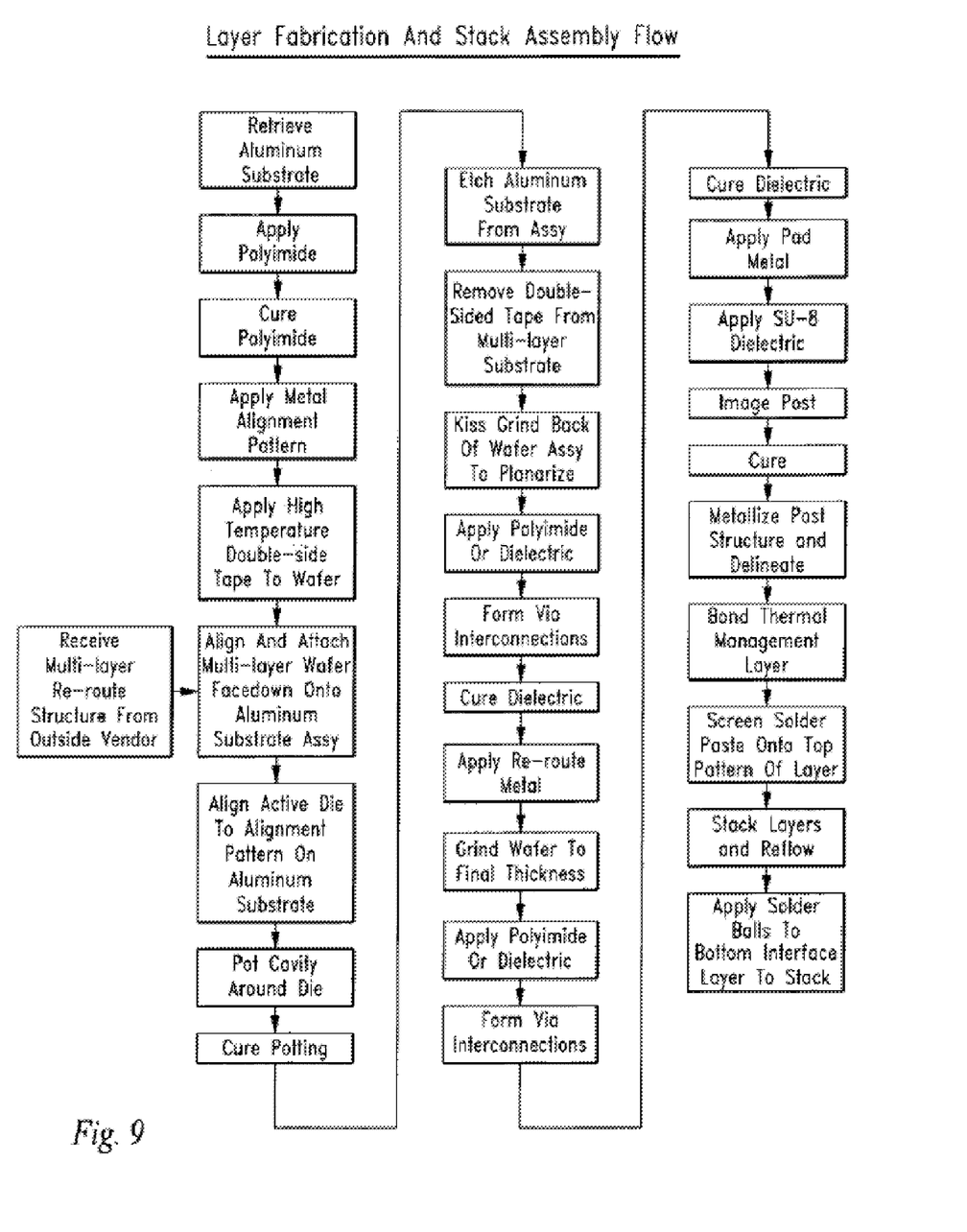
FIG. 9 shows a tier fabrication and stack assembly flow diagram.

A preferred system process flow for the fabrication and assembly of the tier structure and module of the invention is reflected in FIG. 9.

Figure 10A:
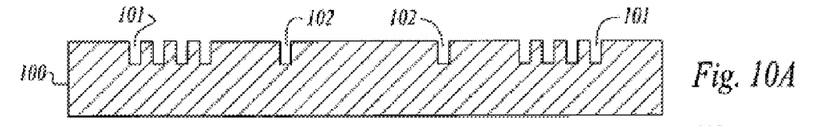
FIGS. 10A through 10N illustrate a method of fabricating a "die-in-silicon" tier and stacked module with concurrent feedthrough structure and metallized polymer column formation.
Figure 10B:
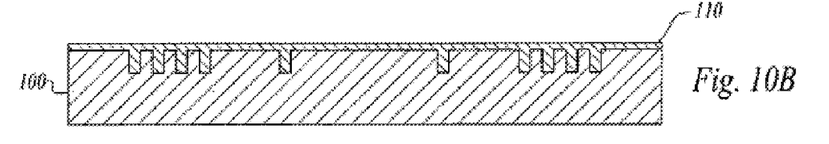
Figure 10C:
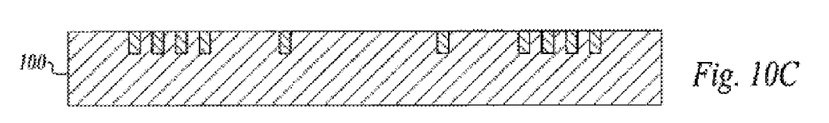
Figure 10D:
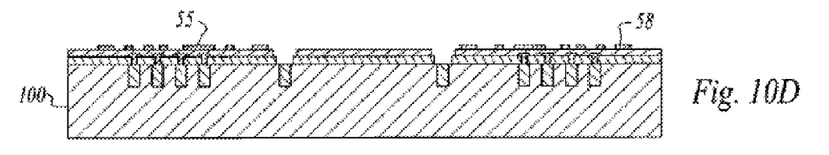
Figure 10E:
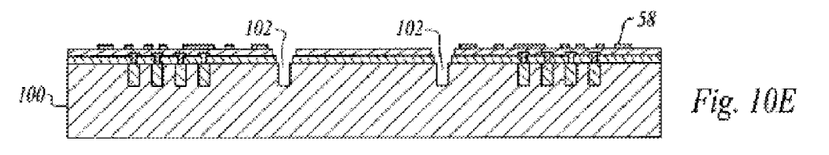
Figure 10F:
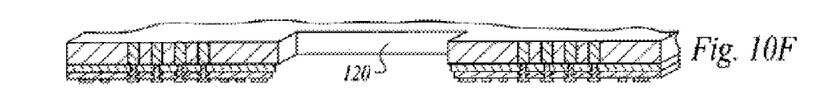
Figures 10G, 10H:
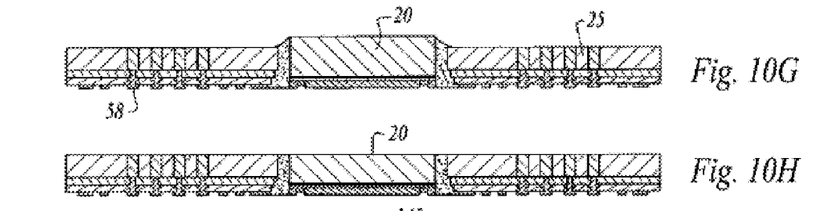
Figure 10J:
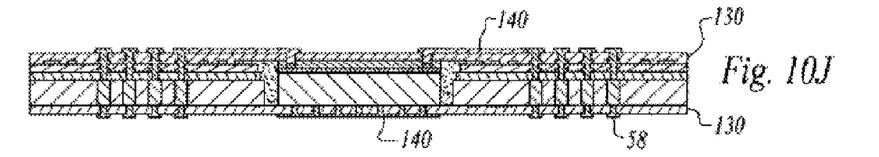
Figure 10K:
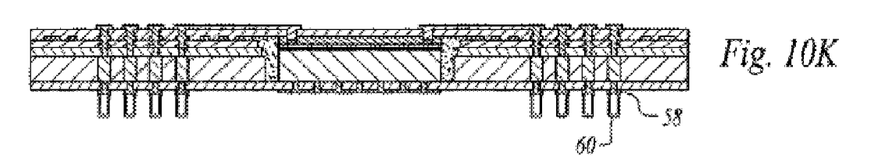
Figure 10L:
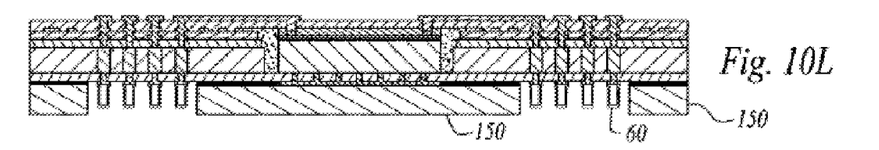
Figure 10M:
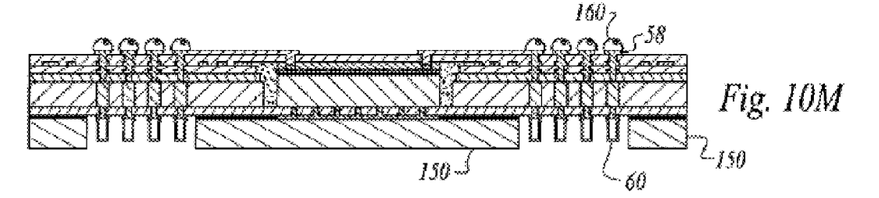
Figure 10N:
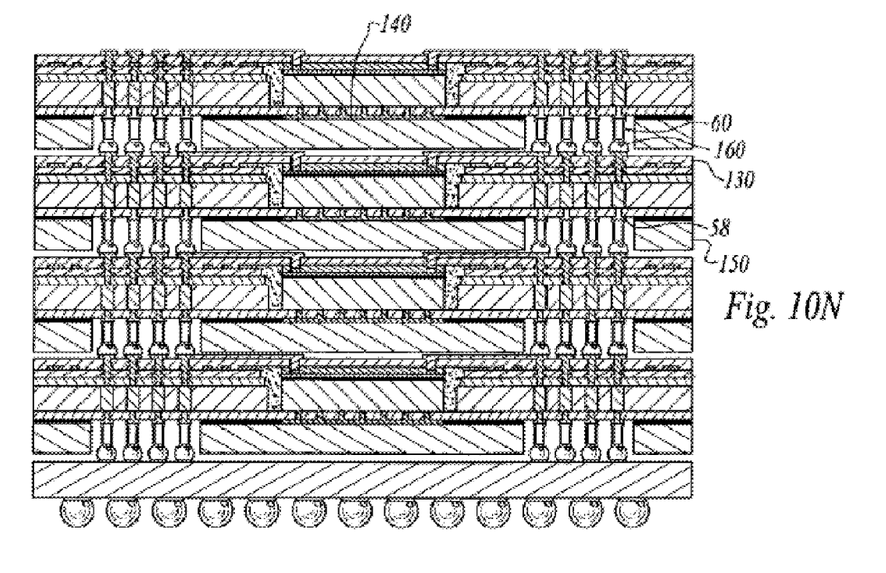

A preferred series of process steps for fabricating the silicon-in-die tier structure and module embodiment with concurrent feedthrough structure and conductive post fabrication is illustrated in FIGS. 10a and 10b, showing a ball grid array interconnect format in the resultant module.

Figure 11:
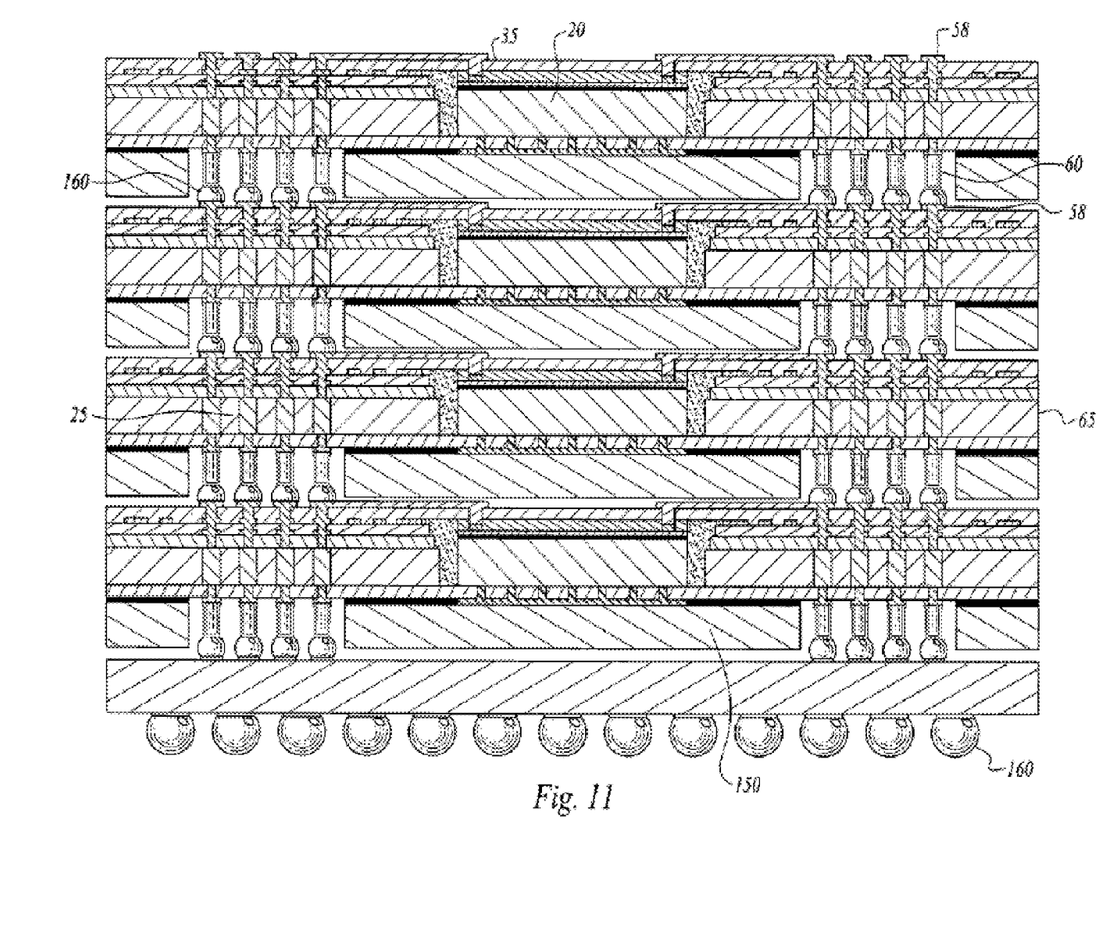
FIG. 11 is a cross-section of an exemplar module comprising a stack of interconnected tiers.
Figure 12:
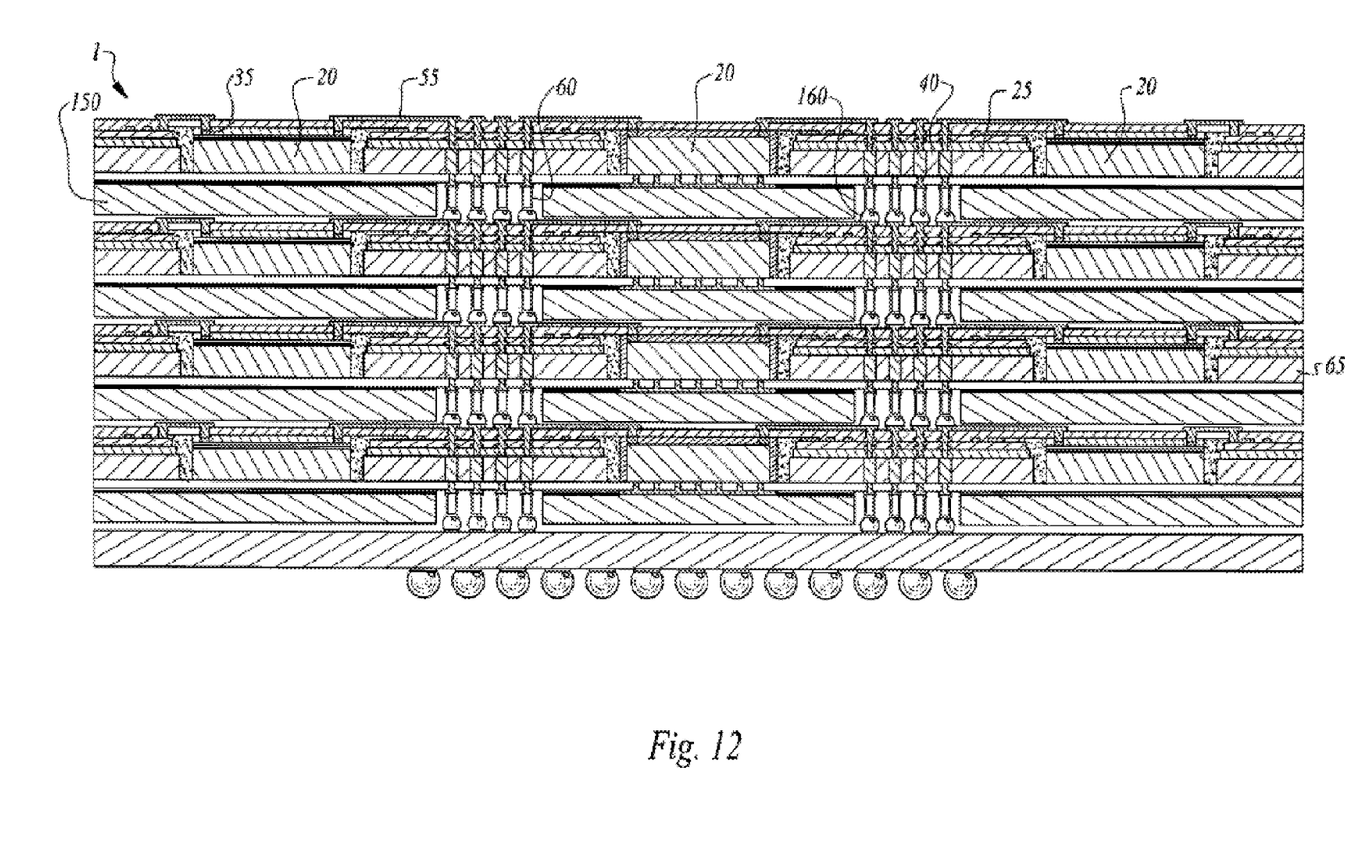
FIG. 12 illustrates a cross-section of an exemplar module comprising a stack of interconnected tiers, each tier comprising an FPGA and two memory devices.

Alternative embodiments of the stacked tier module of the invention reflecting the interconnection using metallized polymer columns and the use of thermal management layers to improve system heat dissipation are shown in FIG. 11 and FIG. 12.

FIG. 11 reflects a four tier module 65 with each layer having a thermal management layer in a ball grid array format. FIG. 12 illustrates an alternative embodiment as a four tier module 65 wherein each layer contains a thermal management layer, an FPGA and two memory devices capable of supporting FPGA functions.

As is seen above, the resultant tier structure and stacked tier module provide for a versatile, modular, high density electronic package capable of high circuit interconnect count and system I/O count, using established semiconductor packaging processes.

It must be understood that the illustrated embodiments have been set forth only for the purpose of example and that they should not be taken as limiting the invention as defined by the following claims. For example, notwithstanding the fact that the elements of a claim are set forth below in a certain combination, it must be expressly understood that the invention includes other combinations of fewer, more or different elements, which are disclosed even when not initially claimed in such combinations.

The words used in this specification to describe the invention and its various embodiments are to be understood not only in the sense of their commonly defined meanings, but to include by special definition in this specification, structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are therefore defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Although elements may be described above as acting in certain combinations and even initially claimed as such, it is to be expressly understood that one or more elements from a claimed combination can, in some cases be excised from the combination and that the claimed combination may be directed to a sub-combination or variation of a sub combination.

Insubstantial changes from the claimed subject matter as viewed by a person with ordinary skill in the art, now known or later devised, are expressly contemplated as being equivalent within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the fundamental idea of the invention.

We claim:

1. A tier structure comprising:
a tier frame including a first tier side, a second tier side, and an integrated circuit die that comprises an I/O pad and a feedthrough structure, wherein the feedthrough structure includes a conductive structure configured to route electrical signals between the first tier side and the second tier side, and wherein the I/O pad is electrically connected to the conductive structure by a conductive trace;
an exposed electrically conductive pad disposed on the first tier side or the second tier side, wherein the exposed electrically conductive pad is electrically connected to the conductive structure; and
a conductive metallized polymer column disposed on the exposed electrically conductive pad, wherein the conductive metallized polymer column includes a photoresist, and wherein the exposed electrically conductive pad is configured for electrical connection to another tier frame.

2. The tier structure of claim 1, wherein the conductive structure comprises a prefabricated conductive via structure.

3. The tier structure of claim 2, further comprising an aperture formed by a dry reactive ion etch process and configured to receive the prefabricated conductive via structure.

4. The tier structure of claim 1, wherein the tier frame further comprises a molded dielectric material.

5. The tier structure of claim 1, wherein the tier frame further comprises a polyimide material.

6. The tier structure of claim 1, wherein the tier frame further comprises silicon and wherein the conductive structure comprises a conductive via defined in the tier frame.

7. The tier structure of claim 6, wherein the silicon has a resistivity of 100 ohms per centimeter.

8. The tier structure of claim 1, wherein the conductive structure comprises a prefabricated metallized polymer column.

9. The tier structure of claim 1, wherein the conductive structure comprises a prefabricated stacked stud bump.

10. The tier structure of claim 1, wherein the exposed electrically conductive pad is electrically connected to the conductive structure by the conductive trace.

11. The tier structure of claim 1, further comprising a solder material disposed between the exposed electrically conductive pad and the conductive metallized polymer column.

12. The tier structure of claim 1, wherein the conductive metallized polymer column is formed from a solderable photoresist.

13. The tier structure of claim 1, wherein the conductive metallized polymer column is formed from a columnar SU-8 structure.

14. The tier structure of claim 1, wherein the conductive metallized polymer column comprises an anisotropic conductive film.

15. The tier structure of claim 1, wherein the conductive metallized polymer column comprises an anisotropic conductive paste.

16. A stack comprising:
a first tier structure including a first tier frame that comprises a first tier side, a second tier side, and a first integrated circuit that includes a first I/O pad and a first feedthrough structure, wherein the first feedthrough structure comprises a first conductive structure electrically connected to the first I/O pad by a first conductive trace and configured to route electrical signals between the first tier side and the second tier side;
a second tier structure including a second tier frame that comprises a third tier side, a fourth tier side, and a second integrated circuit that includes a second I/O pad and a second feedthrough structure, wherein the second feedthrough structure comprises a second conductive structure electrically connected to the second I/O pad by a second conductive trace and configured to route electrical signals between the third tier side and the fourth tier side;
a first electrically conductive pad electrically connected to the first conductive structure and disposed on the first tier side or the second tier side;
a second electrically conductive pad electrically connected to the second conductive structure and disposed on the third tier side or the fourth tier side; and
a metallized polymer column configured to electrically connect the first I/O pad to the second I/O pad, wherein the metallized polymer column includes a photoresist.

17. The stack of claim 16, wherein the metallized polymer column comprises an anisotropic conductive film.

18. The stack of claim 16, wherein the metallized polymer column comprises an anisotropic conductive paste.

19. The stack of claim 16, further comprising a thermal management layer disposed between the first tier structure and the second tier structure.

20. The stack of claim 16, wherein the first electrically conductive pad is electrically connected to the first conductive structure by the first conductive trace, and wherein the second electrically conductive pad is electrically connected to the second conductive structure by the second conductive trace.

21. The stack of claim 16, wherein each of the first conductive structure and the second conductive structure comprises a prefabricated conductive via structure.

22. The stack of claim 16, wherein at least one of the first conductive structure or the second conductive structure comprises a prefabricated metallized polymer column.

23. The stack of claim 16, further comprising a first solder material disposed between the metallized polymer column and at least one of the first electrically conductive pad or the second electrically conductive pad.

24. The stack of claim 16, further comprising a copper shim disposed between the first tier structure and the second tier structure.

* * * * *

UNITED STATES PATENT AND TRADEMARK OFFICE
CERTIFICATE OF CORRECTION

| | | |
|---|---|---|
| PATENT NO. | : 7,768,113 B2 | Page 1 of 1 |
| APPLICATION NO. | : 11/441908 | |
| DATED | : August 3, 2010 | |
| INVENTOR(S) | : Volkan Ozguz | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 421 days.

Signed and Sealed this
Twenty-ninth Day of March, 2011

David J. Kappos
*Director of the United States Patent and Trademark Office*